(12) United States Patent
Chen

(10) Patent No.: US 6,285,624 B1
(45) Date of Patent: Sep. 4, 2001

(54) MULTILEVEL MEMORY ACCESS METHOD

(76) Inventor: Han-Ping Chen, P.O. Box 2871, Saratoga, CA (US) 95070

( * ) Notice: Subject to any disclaimer, the term of this patent is extended or adjusted under 35 U.S.C. 154(b) by 0 days.

(21) Appl. No.: 09/612,171

(22) Filed: Jul. 8, 2000

(51) Int. Cl.[7] .................................................. G11C 8/00
(52) U.S. Cl. ................... 365/230.03; 365/185.03
(58) Field of Search .............................. 365/230.03, 45, 365/185.03, 49

(56) References Cited

U.S. PATENT DOCUMENTS

| | | | |
|---|---|---|---|
| 5,745,409 | * 4/1998 | Wong et al. | 365/185.03 |
| 6,151,235 | * 11/2000 | Kitagawa et al. | 365/45 |
| 6,208,542 | * 3/2001 | Wang et al. | 365/45 |

* cited by examiner

Primary Examiner—Richard Elms
Assistant Examiner—Anh Phung

(57) ABSTRACT

A method and apparatus provides multi-level memory data input-output signals to speed up the memory data transfer rate between a memory controlling device and a memory device to increase the utilization of the data width of the memory cell array. Also, the present invention provides a method that is compatible with the structure of existing memory chips and modules.

19 Claims, 14 Drawing Sheets

- PRIOR ART -

- PRIOR ART -

- PRIOR ART -

MULTILEVEL MEMORY ACCESS METHOD

BACKGROUND OF THE INVENTION

This invention relates to semiconductor memory devices, memory chips, memory modules, and memory controllers.

Because of the physical structure, a memory cell array is organized as a large number of rows by a large number of columns. The maximum potential width for parallel data transfer equals the number of columns times the number of bit planes. For a 64 mega-bit memory chip organized as 8192 rows, 1024 columns, and 8 bits, the maximum data width is 8192 bits.

However, due to the pin count limitation of semiconductor chips and modules, the actual data transfer width is set to be a much smaller number. The data input-output width for a memory chip is typically 1, 2, 4, 8, or 16 bits.

Internally, many columns of a memory cell array are multiplexed together to form a memory input-output data bit line. In doing so, the speed of memory data transfer is limited to the width and frequency of the memory data line.

For a memory chip with an 8192-row 1024-column 8-bit cell array, the 1024 columns are multiplexed into a 1-bit memory data line. The data width of the memory array is reduced by a factor of 1024.

As the density of the semiconductor memory device increases, the size of the memory cell array increases as well. The data width reduction factor also becomes larger.

The system functionality demands high-speed processing of a large amount of memory data. As the speed of the processing unit increases to a higher level, the limitation in memory data transfer rate becomes a severe speed bottleneck for a processing system.

BRIEF SUMMARY OF THE INVENTION

This invention proposes a method and apparatus to increase the speed of the memory data transfer.

This invention further provides a method to maximize the utilization of the speed and data width of the memory cell array.

The present invention provides a method that adjusts the memory data transfer according to the operating condition of the memory devices.

The present invention further provides a method that is compatible with the structure of existing memory chips and modules.

DETAILED DESCRIPTION OF THE INVENTION

The present invention will be illustrated with some preferred embodiments.

Figure 1:
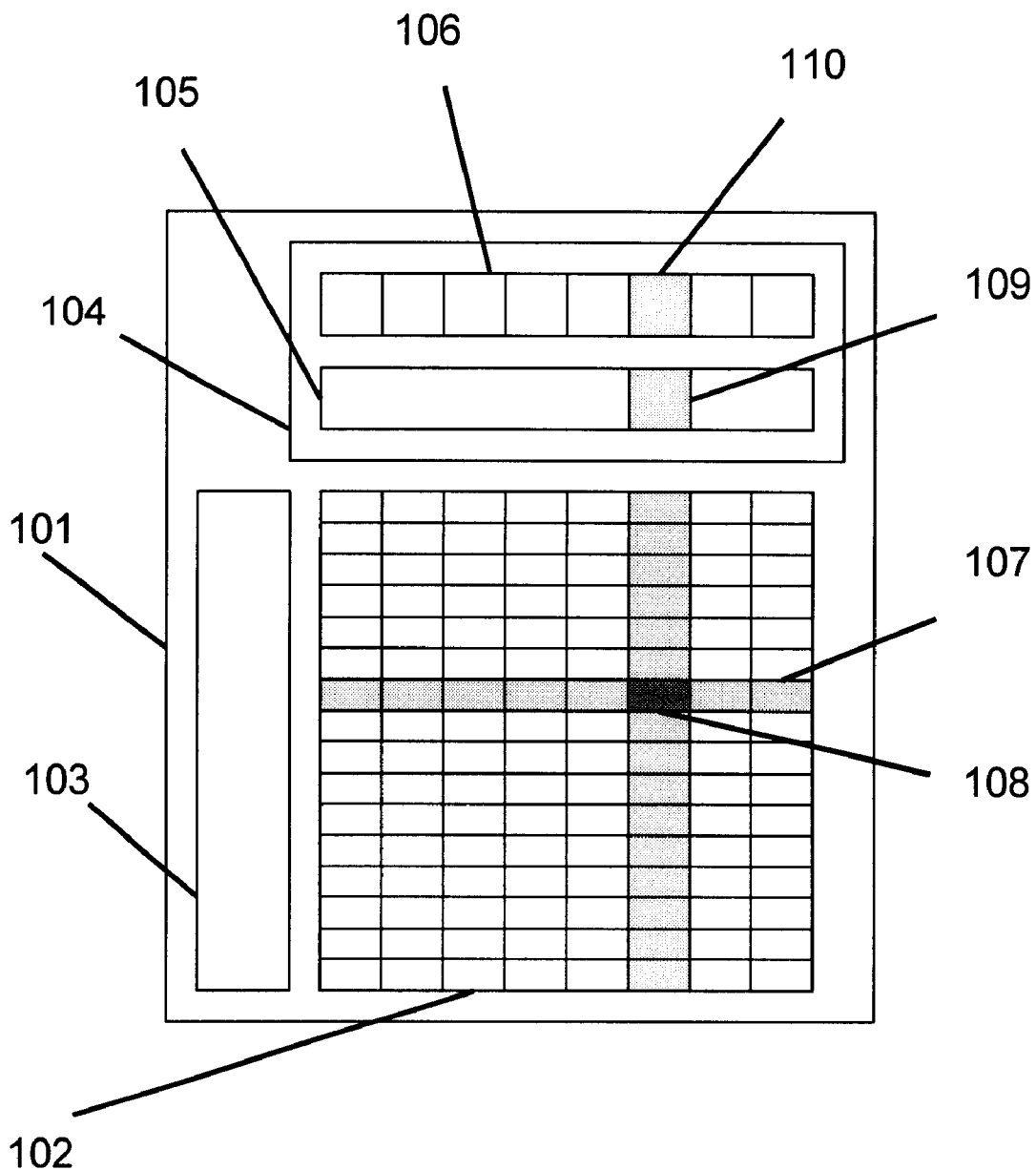
FIG. 1 is a diagram of a prior art memory chip.

FIG. 1 is a diagram of a prior art memory chip. The memory device 101 contains a memory cell array 102, a memory address row-decoding unit 103, and a memory data input-output unit 104. The memory data input-output unit 104 consists of a column multiplexing-distributing unit 105 and an input-output data-bit driving unit 106.

For a particular memory access, the address row-decoding unit 103 selects a memory row 107 in the memory cell array 102. The selected data row signals are connected to the column multiplexing-distributing unit 105. The selected signals are linked to the corresponding bit position in the input-output data-bit driving unit 106.

As an example, for the selected bit position, the data signals 108 are connected to the column multiplexing-distributing bit position 109, which is further linked to the input-output data-bit driving bit position 110.

Figure 2:
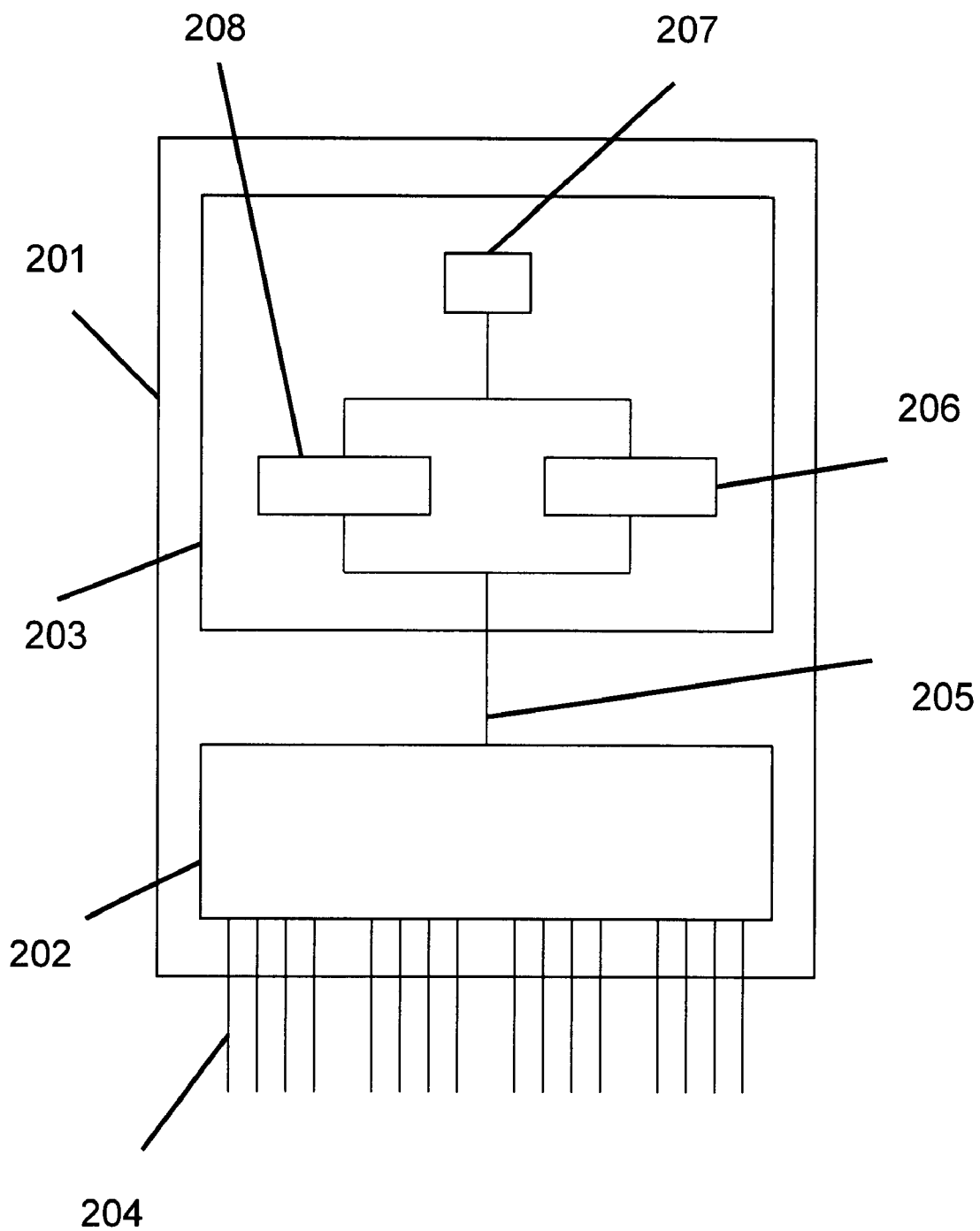
FIG. 2 is a diagram of a prior art data input-output unit in a memory chip.

FIG. 2 is a diagram of a prior art data input-output block in a memory chip. The memory data input-output unit 201 consists of a column multiplexing-distributing unit 202 and an input-output data-bit driving unit 203.

For memory read access, the selected data signals on data lines 204 are sent to the column multiplexing-distributing unit 202. The output signal on data line 205 is sent to the input-output data-bit driving unit 203. The output signal further passes through an output signal driving circuit 206 to reach the input-output pad 207.

For memory write access, the input signal from the input-output pad 208 passes through an input signal receiving circuit 208 to data line 205. The input signal is connected through the column multiplexing-distributing unit 202 to the appropriate memory column signal on data lines 204.

For illustration purpose, assume that the memory cell array contains 1024 columns. There are 1024 lines on the data lines 204. The column multiplexing-distributing unit 202 reduces the data width to 1 bit on data line 205.

The data input-output signal on the input-output pad 207 is a binary signal with 2 signal states, a 0 state and a 1 state. The 0 state corresponds to a common voltage level. The 1 state corresponds to a single positive voltage level.

Figure 3:
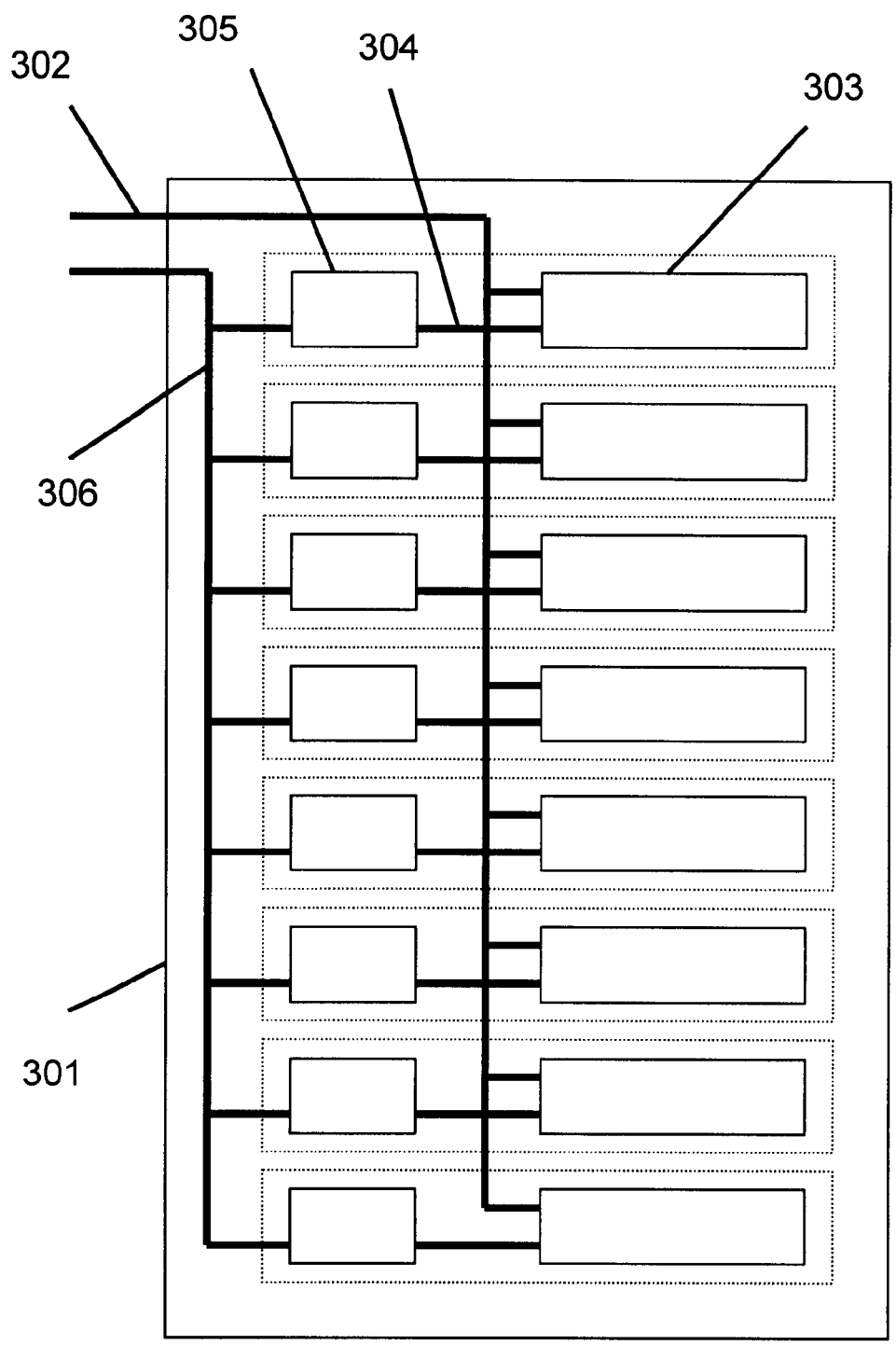
FIG. 3 is a diagram of a prior art memory module.

FIG. 3 is a diagram of a prior art memory module. The memory module 301 receives address-control signals on a memory address-control bus 302. The address-control signals select memory data from the memory device 303. The selected memory data is placed on a device data port 304. The memory data further passes through a connection element 305 to reach the memory data bus 306. The combination of a memory device 303 and a connection element 305 constitutes a memory unit. This memory module contains a total of eight memory units.

Figure 4:
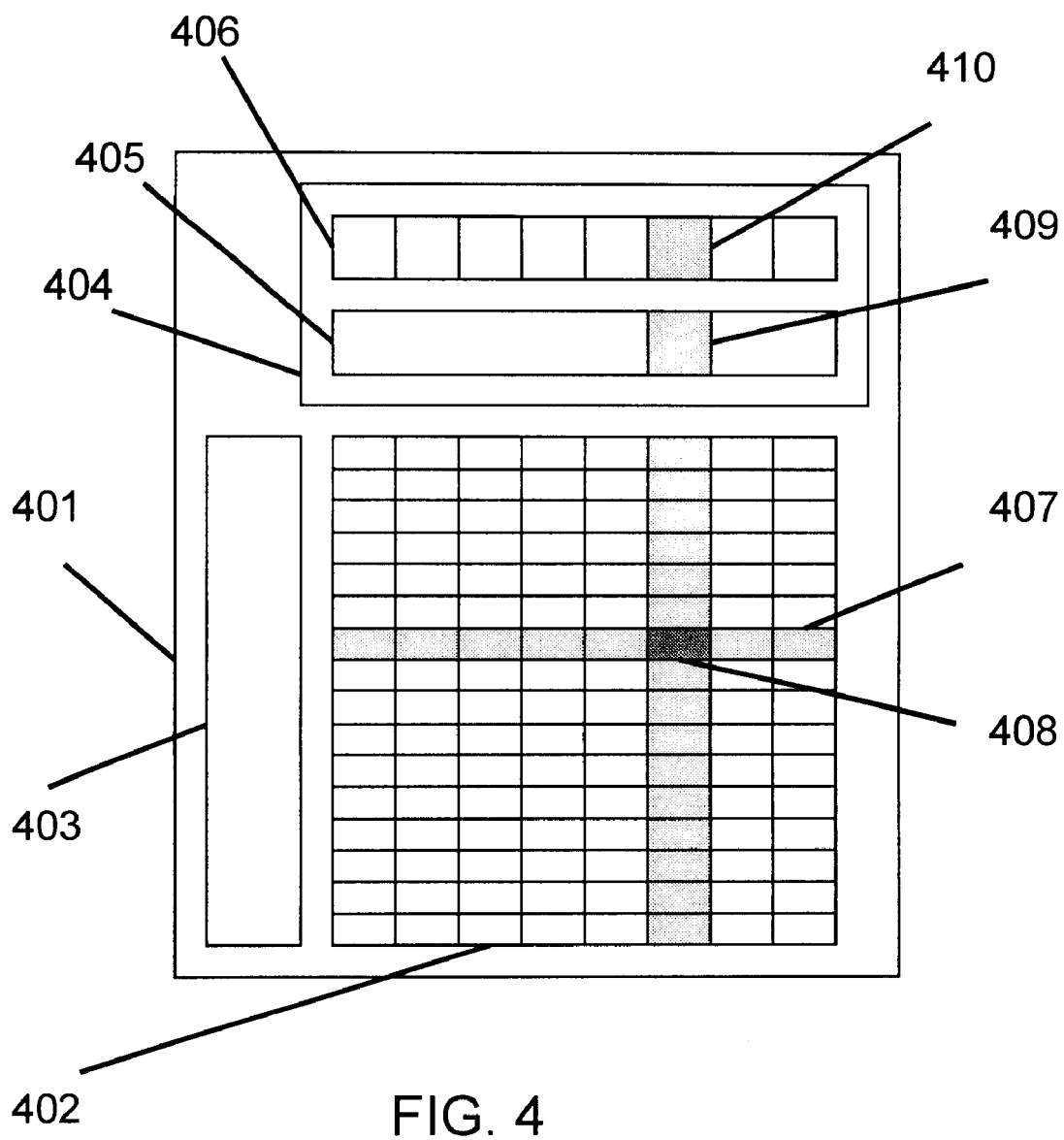
FIG. 4 shows a preferred embodiment of the present invention for a memory chip.

FIG. 4 is a diagram of a preferred embodiment of the present invention for a memory chip. The memory device 401 contains a memory cell array 402, a memory address row-decoding unit 403, and a memory data input-output unit 404. The memory data input-output unit 404 consists of a data input-output formatting unit 405 and an input-output level-conversion unit 406.

For a particular memory access, the address unit 403 selects a memory row 407 in the memory cell array 402. The selected data row signals are connected to the data input-output formatting unit 405. The selected signals are linked to the corresponding bit position in the input-output level-conversion unit 406.

As an example, for the selected bit position, the selected data signals 408 are connected to the input-output formatting bit position 409, which is further linked to the input-output level-conversion bit position 410.

Figure 5:
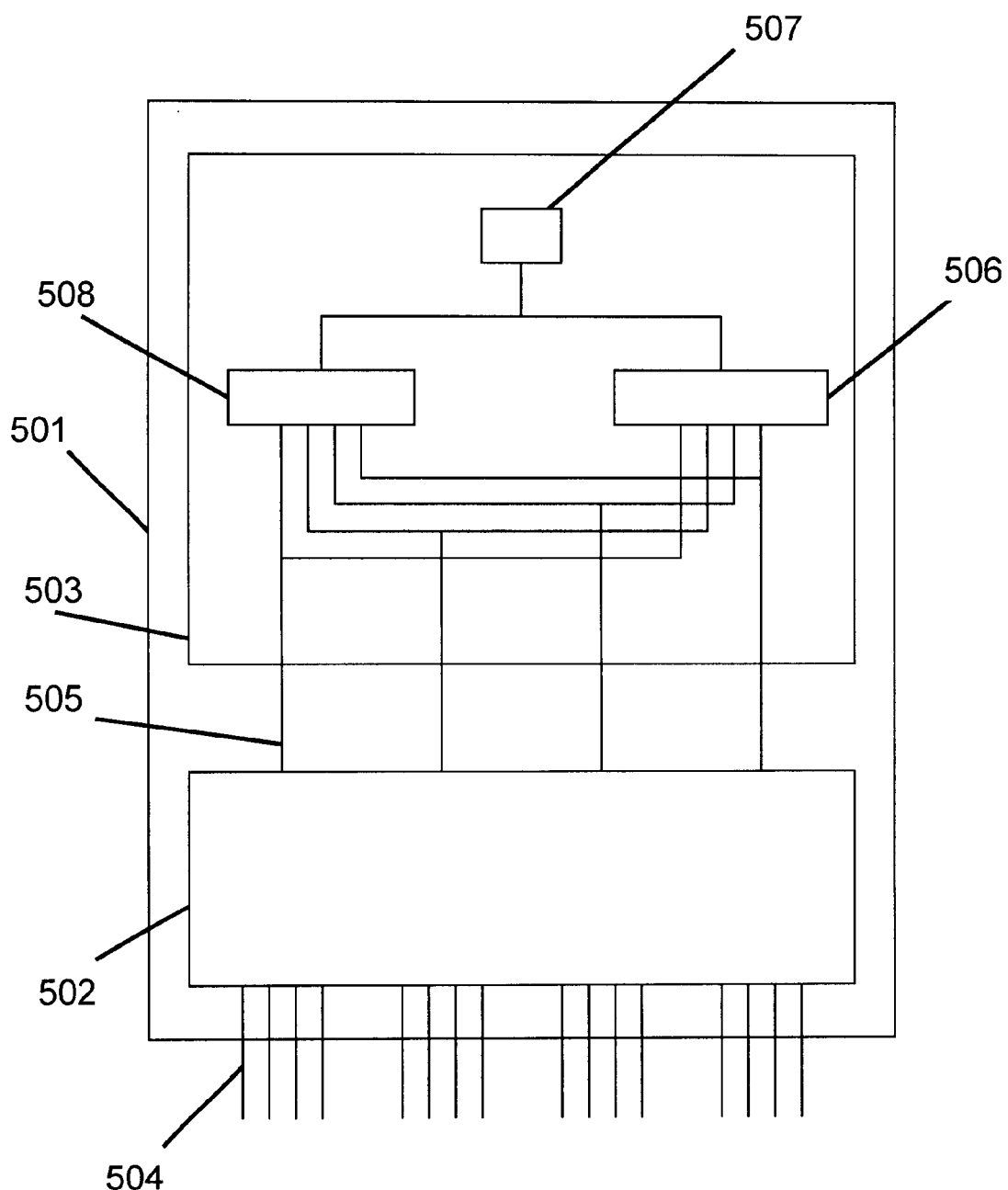
FIG. 5 shows a preferred embodiment of the present invention for a data input-output unit in a memory chip.

FIG. 5 is a diagram of a preferred embodiment of the present invention for a data input-output unit in a memory chip. The memory data input-output unit 501 consists of a data input-output formatting unit 502 and an input-output level-conversion unit 503.

For memory read access, the selected data signals on data lines 504 are sent to the data input-output formatting unit 502. The output signals on data lines 505 are sent to the input-output level-conversion unit 503. The output signal further passes through an output signal level-conversion circuit 506 to reach the input-output pad 507.

For memory write access, the in put signal from the input-output pad 507 passes through an input signal receiving circuit 508 to data lines 505. The input signals are connected to the appropriate memory column signals on data lines 504.

For illustration purpose, assume that the memory cell array contains 1024 columns. There are 1024 lines on the data lines 504. Also assume that we use a 16-level data signal on input-output pad 507 for memory data transfer.

The data input-output formatting unit 502 reduces the data width to 4 bits on data lines 505. The data input-output signal on the input-output pad 507 is a multi-state signal with 16 signal states. There are 16 voltage levels each defined as a range of signal voltage values.

With a data input-output unit in FIG. 5, the memory data transfer rate for a memory system in FIG. 4 is increased by a factor of 4 compared to the memory data transfer rate for a memory system in FIG. 1.

Figure 6:
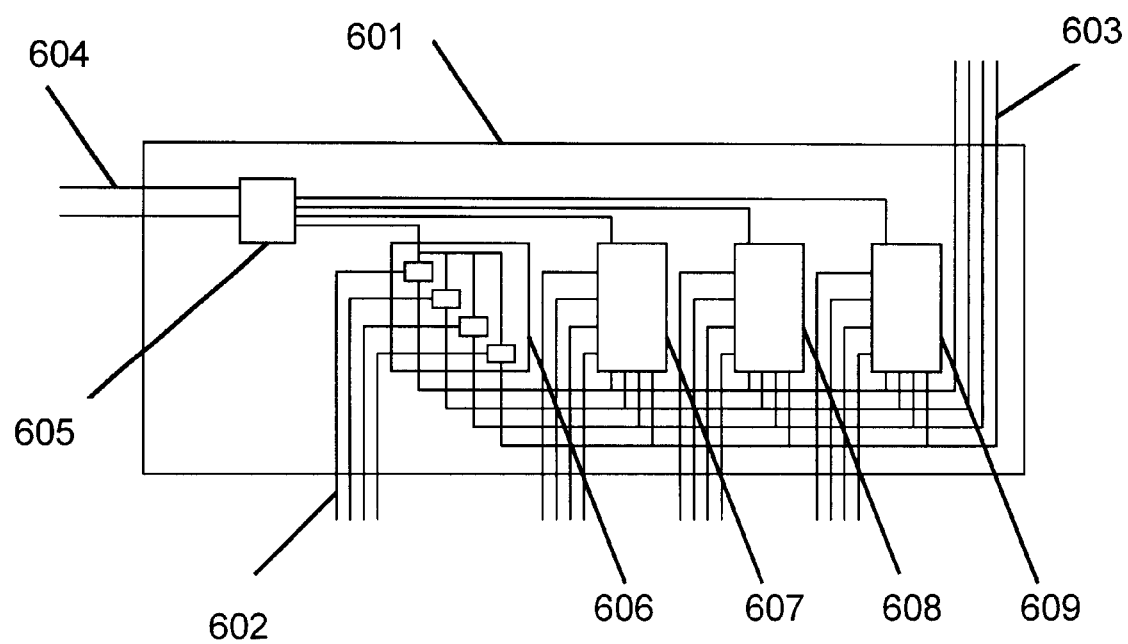
FIG. 6 shows a preferred embodiment of the present invention for a data input-output formatting unit in a memory chip.

FIG. 6 is a diagram of a preferred embodiment of the present invention for a data input-output formatting unit in a memory chip. The selected data signals on data lines 602 are connected to input-output data lines 603 through the data formatting unit 601.

The data transfer is controlled by the address signals A3 and A2 on address lines 604. The address signals are decoded in the address-decoding unit 605 into 4 enabling signals. These 4 enabling signals connect the selected data lines in data lines 602 to input-output data lines 603 through the data connection units 606, 607, 608, and 609.

Figure 7:
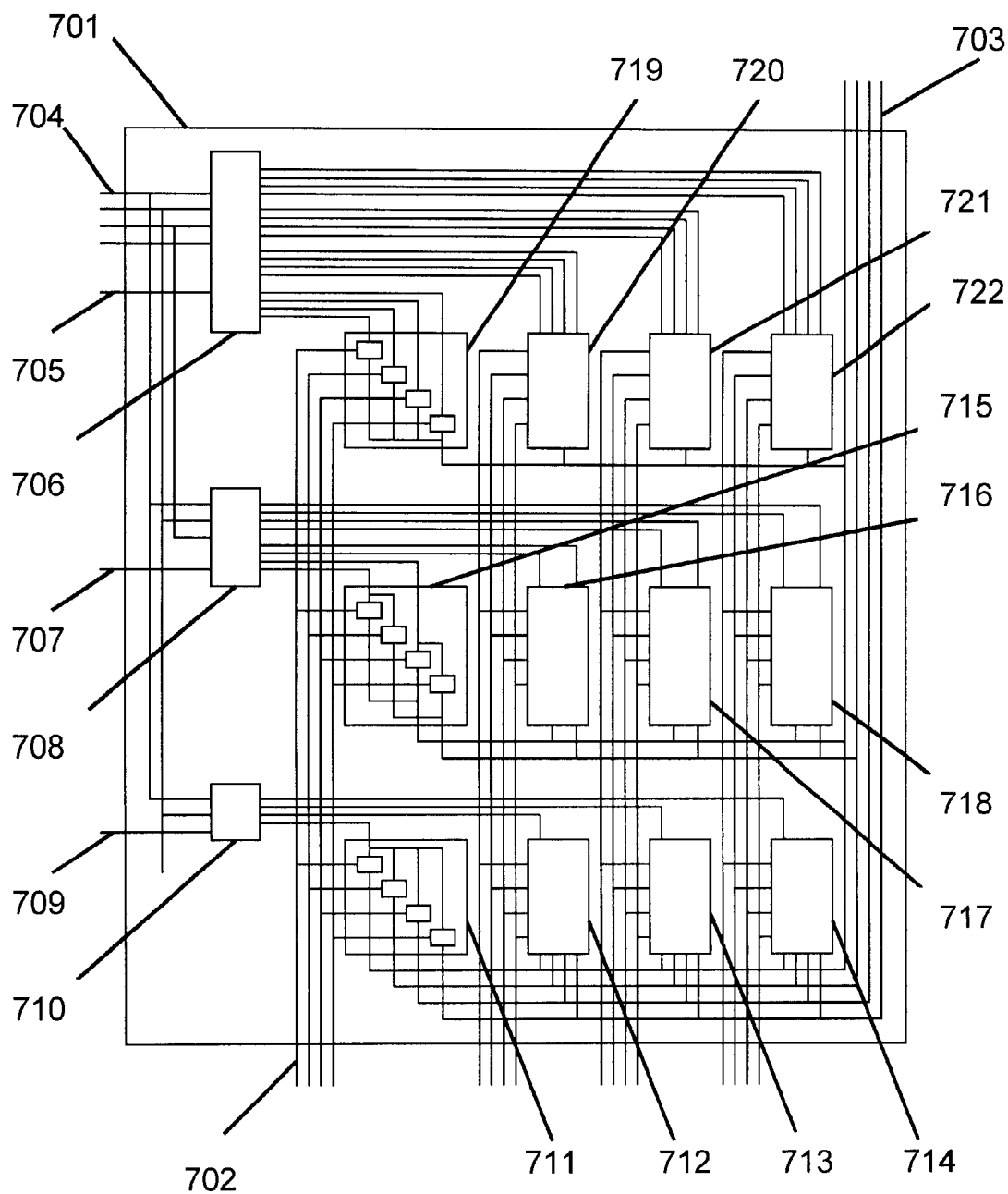
FIG. 7 shows another preferred embodiment of the present invention for a data input-output formatting unit in a memory chip.

FIG. 7 is a diagram of another preferred embodiment of the present invention for a data input-output formatting unit in a memory chip. This preferred embodiment supports variable-level memory data transfer to adapt to operational conditions. In this example, it supports 16-level, 4-level, and 2-level memory data formats. In the case of 2-level data format, it maintains the compatibility to the conventional binary memory data transfer.

The selected data signals on data lines 702 are connected to input-output data lines 703 through the data formatting unit 701. The data transfer is controlled by the address signals A3, A2, A1, and A0 on address lines 704. It is also controlled by data transfer mode-enabling signals 705, 707, and 709.

For 16-level data transfer, data transfer mode-enabling signal 709 enables the decoding of the address signals A3 and A2 in the address-decoding unit 710 into 4 enabling signals. These 4 enabling signals connect the selected data lines in data lines 702 to input-output data lines 703 through the data connection units 711, 712, 713, and 714.

For 4-level data transfer, data transfer mode-enabling signal 707 enables the decoding of the address signals A3, A2 and A1 in the address-decoding unit 708 into 8 enabling signals. These 8 enabling signals connect the selected data lines in data lines 702 to input-output data lines 703 through the data connection units 715, 716, 717, and 718.

For 2-level binary data transfer, data transfer mode-enabling signal 705 enables the decoding of the address signals A3, A2, A1 and A0 in the address-decoding unit 706 into 16 enabling signals. These 16 enabling signals connect the selected data lines in data lines 702 to input-output data lines 703 through the data connection units 719, 720, 721, and 722.

The data transfer mode-enabling signals 705, 707, and 709 may be set by hardwire, logic, or programmable bit values.

For the same memory device, the data transfer rates for a memory read operation and a memory write operation need not be at the same speed. They may be set to different data transfer modes to obtain the most effective data transfer under certain operating conditions.

For the same memory device, the data transfer mode may also change dynamically over time to accommodate the operational need. For example, the data transfer mode may be set to binary mode initially. After an initialization process, it may then be set to a selected read transfer mode and a selected write transfer mode.

The multilevel method is also applicable on the address-control signal lines. Binary and multilevel signals may be used on the address-control lines and data lines independently or simultaneously. These signals may also be asymmetric or variable with time.

Multilevel memory chips may be used to construct binary memory modules for existing binary memory systems. Existing binary memory chips may also be used to construct multilevel memory modules in new multilevel memory systems.

Figure 8:
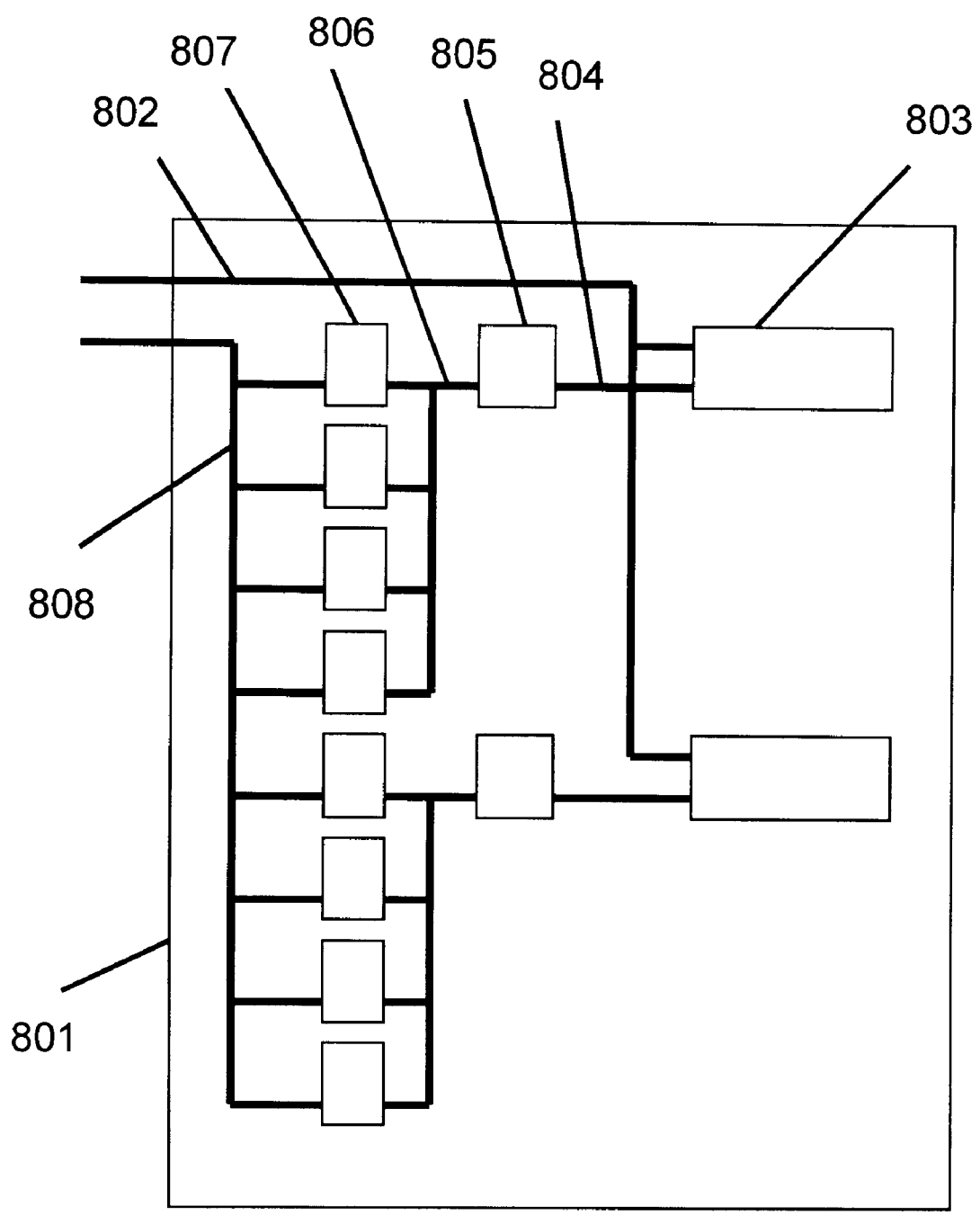
FIG. 8 shows a preferred embodiment of the present invention for a binary memory module using multilevel memory chips.

FIG. 8 is a diagram of a preferred embodiment of the present invention for a binary memory module using multilevel memory devices. The memory module 801 receives address-control signals on a memory address-control bus 802. The address-control signals select memory data from a multilevel memory device 803. The selected multilevel memory data is placed on a multilevel device data port 804. A multilevel-to-binary signal converter 805 transforms the multilevel memory data 804 to binary memory data 806. The binary memory data further passes through a connection element 807 to reach the binary memory data bus 808.

Figure 9:
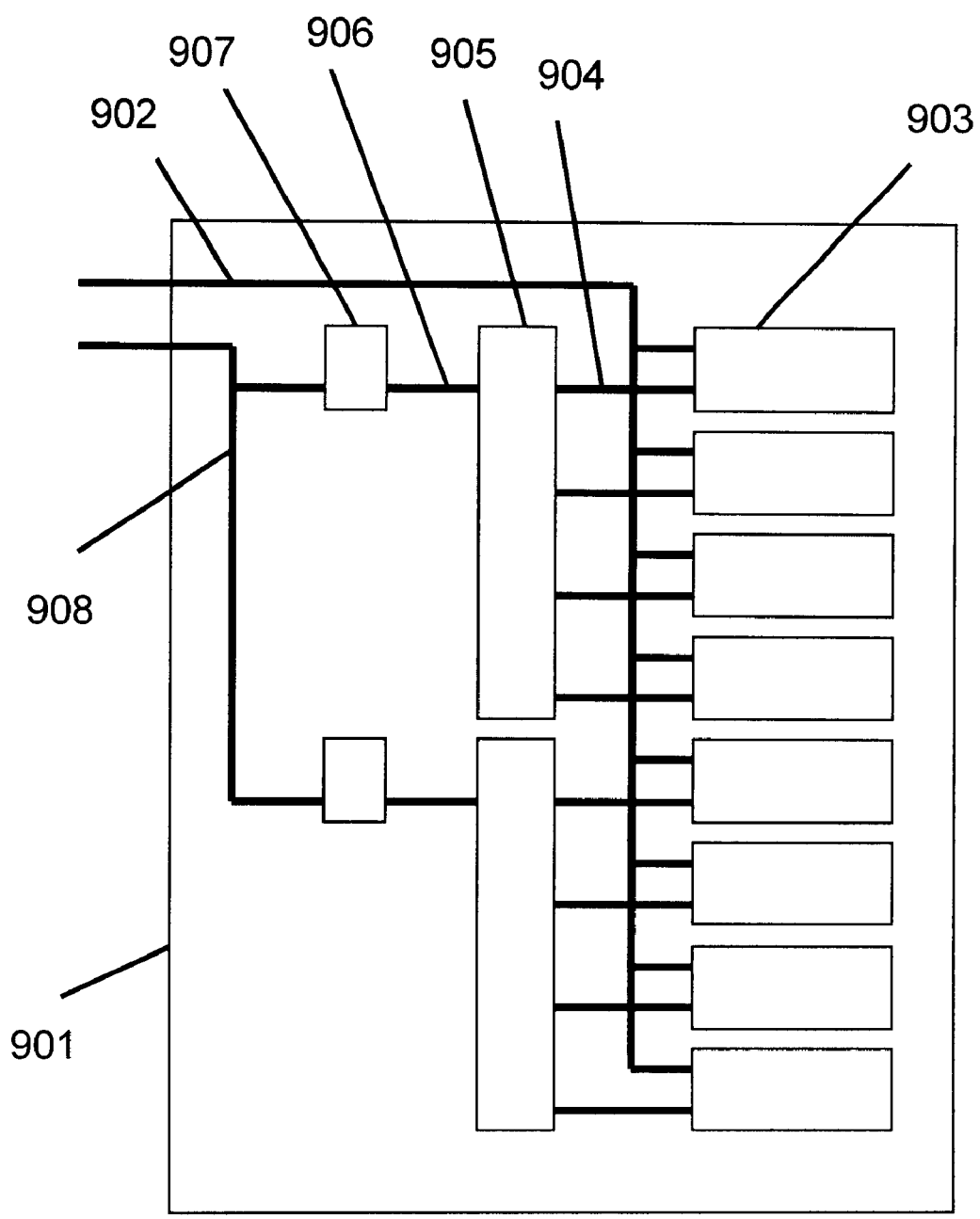
FIG. 9 shows another preferred embodiment of the present invention for a multilevel memory module using binary memory chips.

FIG. 9 is a diagram of a preferred embodiment of the present invention for a multilevel memory module using binary memory devices. The memory module 901 receives address-control signals on a memory address-control bus 902. The address-control signals select memory data from a binary memory device 903. The selected binary memory data is placed on a binary device data port 904. A binary-to-multilevel signal converter 905 transforms the binary memory data 904 to multilevel memory data 906. The multilevel memory data further passes through a connection element 907 to reach the multilevel memory data bus 908.

Figure 10:
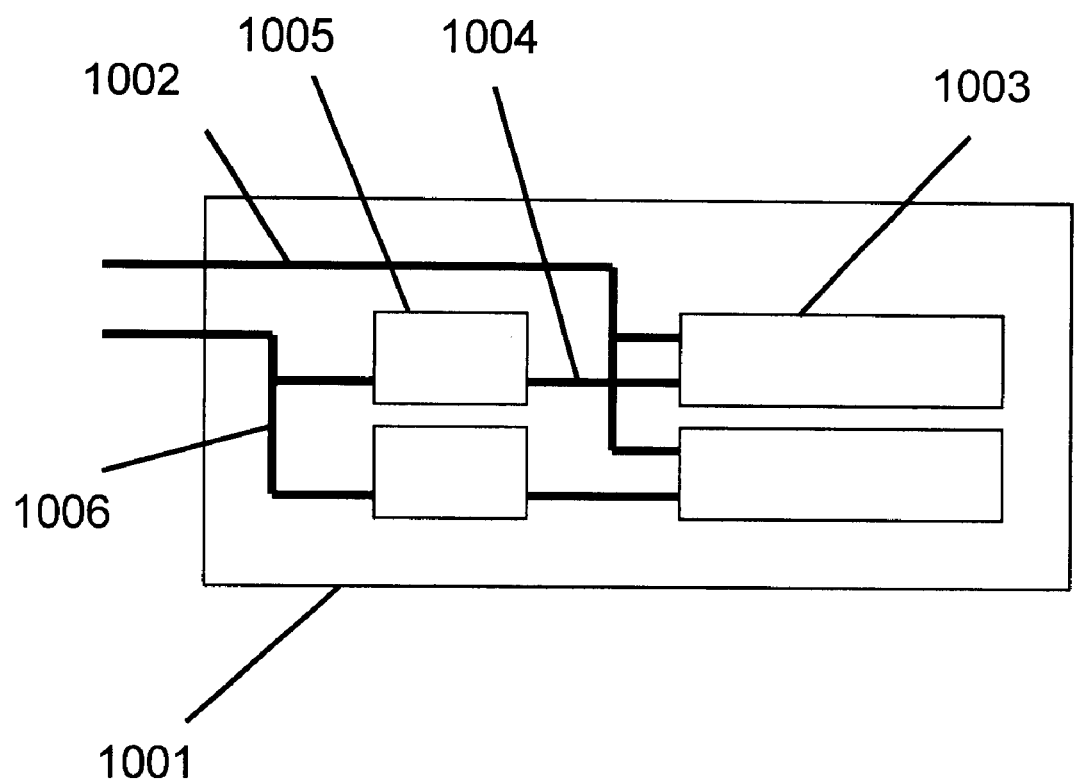
FIG. 10 shows another preferred embodiment of the present invention for a multilevel memory module using multilevel memory chips.

FIG. 10 is a diagram of a preferred embodiment of the present invention for a multilevel memory module using multilevel memory devices. The memory module 1001 receives address-control signals on a memory address-control bus 1002. The address-control signals select memory data from a multilevel memory device 1003. The selected binary memory data is placed on a multilevel device data port 1004. The multilevel memory data further passes through a connection element 1005 to reach the multilevel memory data bus 1006.

Figure 11:
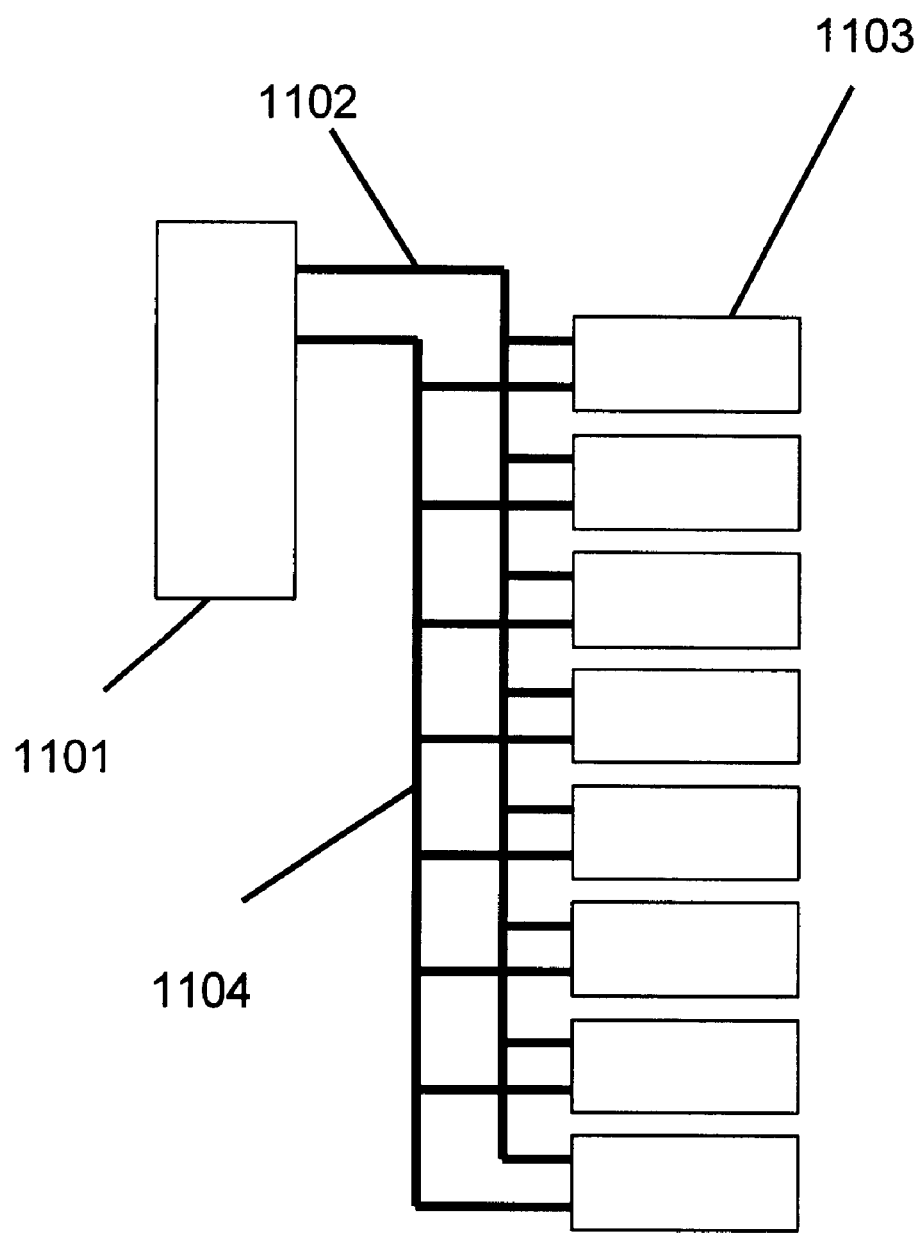
FIG. 11 is a diagram of a prior art memory access system.

FIG. 11 is a diagram of a prior art memory access system. The memory access controller 101 generates address-control signals on a memory address-control bus 1102. The address-control signals select memory data from a binary memory device 1103. The selected binary memory data is placed on a binary device data bus 1104.

Figure 12:
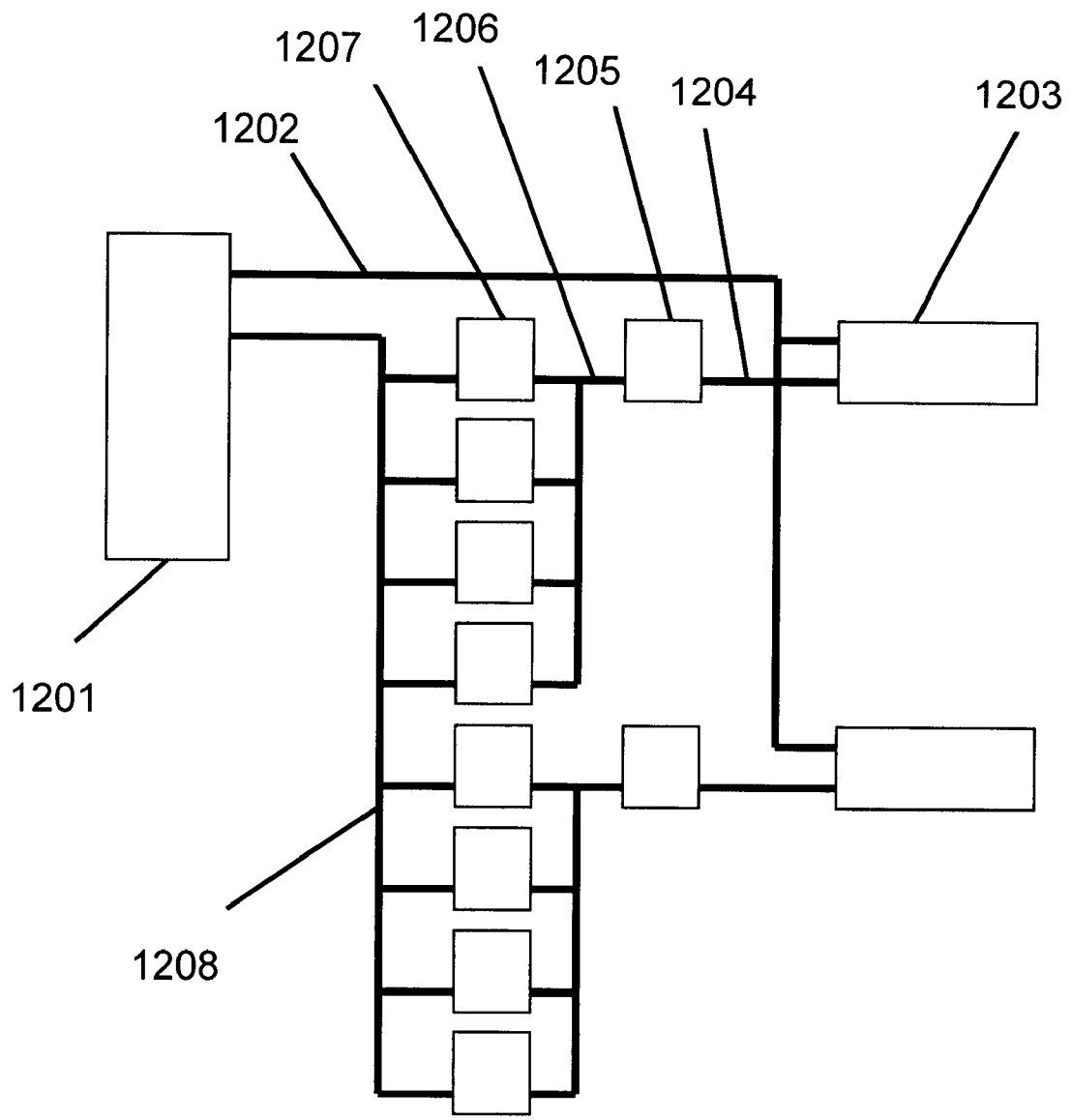
FIG. 12 shows a preferred embodiment of the present invention for a binary memory access system using multilevel memory chips.

FIG. 12 shows a preferred embodiment of the present invention for a binary memory access system using multilevel memory chips. The memory access controller 1201 generates address-control signals on a memory address-control bus 1202. The address-control signals select memory data from a multilevel memory device 1203. The selected multilevel memory data is placed on a multilevel device data port 1204. A multilevel-to-binary signal converter 1205 transforms the multilevel memory data 1204 to binary memory data 1206. The binary memory data further passes through a connection element 1207 to reach the binary memory data bus 1208.

Figure 13:
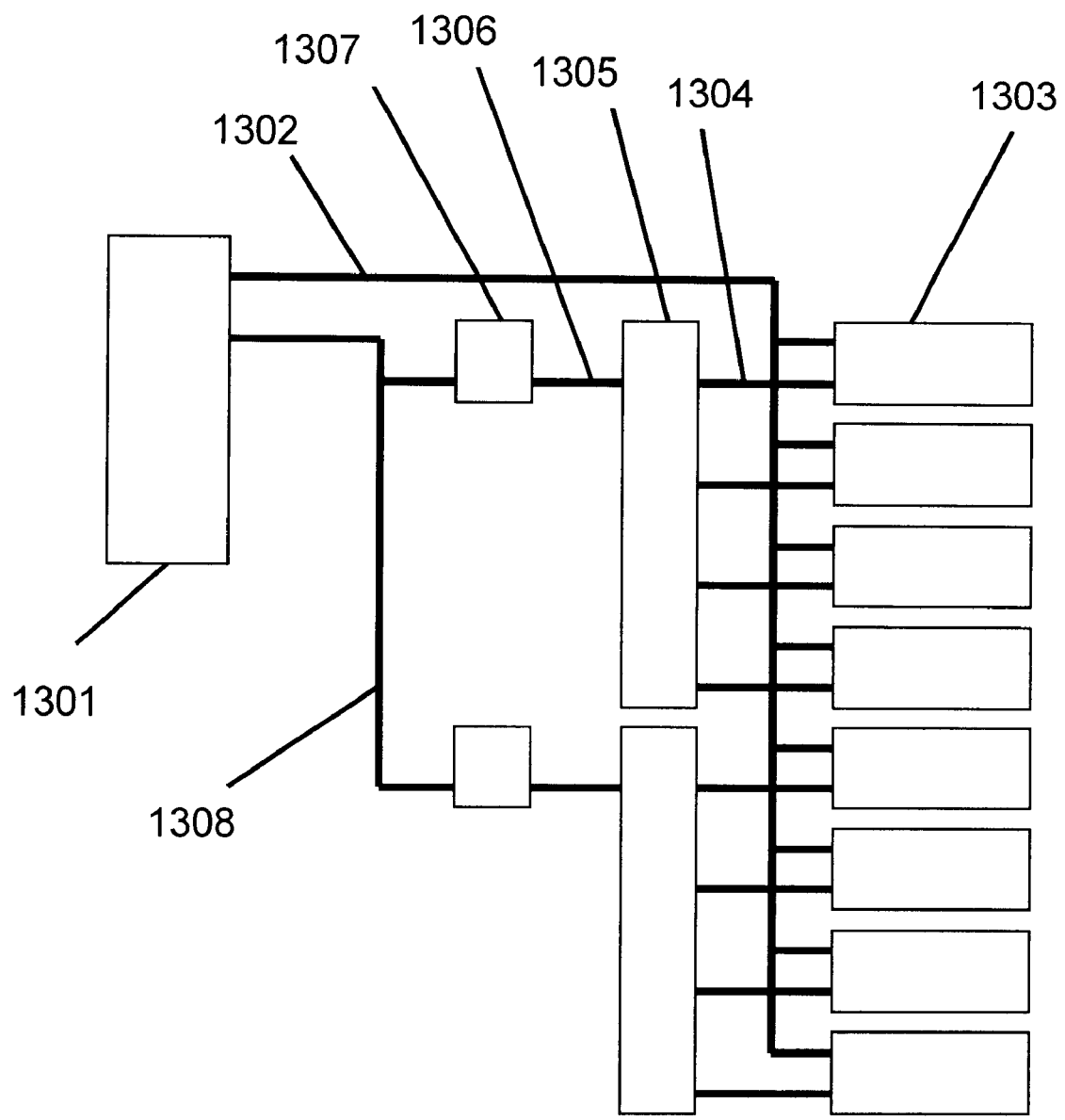
FIG. 13 shows another preferred embodiment of the present invention for a multilevel memory access system using binary memory chips.

FIG. 13 shows another preferred embodiment of the present invention for a multilevel memory access system using binary memory chips. The memory access controller 1301 generates address-control signals on a memory address-control bus 1302. The address-control signals select memory data from a binary memory device 1303. The selected binary memory data is placed on a binary device data port 1304. A binary-to-multilevel signal converter 1305 transforms the binary memory data 1304 to multilevel memory data 1306. The multilevel memory data further passes through a connection element 1307 to reach the multilevel memory data bus 1308.

Figure 14:
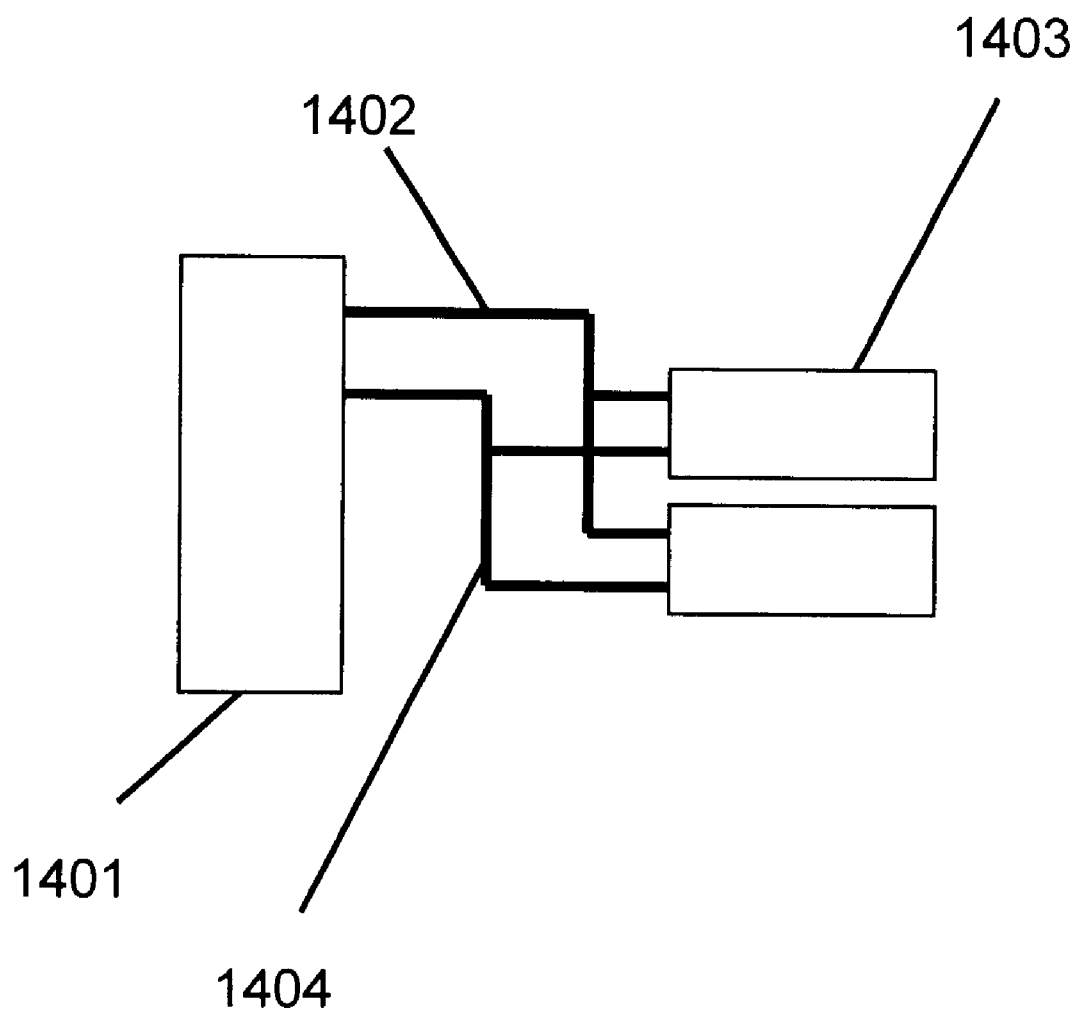
FIG. 14 shows another preferred embodiment of the present invention for a multilevel memory access system using multilevel memory chips.

FIG. 14 shows another preferred embodiment of the present invention for a multilevel memory access system using multilevel memory chips. The memory access controller 1401 generates address-control signals on a memory address-control bus 1402. The address-control signals select memory data from a multilevel memory device 1403. The selected binary memory data is placed on a multilevel device data port 1404. The multilevel memory data further passes through a connection element 1405 to reach the multilevel memory data bus 1406.

I claim:

1. A memory access control system comprising:

(a) a memory system controller;

(b) a plurality of memory system address-control lines;

(c) a plurality of binary memory system data lines;

(d) a plurality of multilevel memory system data lines;

(e) a plurality of first multilevel-to-binary data signal converters;

(f) a plurality of memory devices, each having a plurality of memory device address-control lines, a plurality of binary memory device data lines, a plurality of binary memory cells, and a plurality of first binary-to-multilevel data signal converters;

wherein the memory controller generates memory address-control signals on the memory system address-control lines;

wherein memory address-control signals on the memory device address-control lines are derived, at least in part, from the memory system address-control lines.

wherein memory data from memory cells are selected by the memory device address-control lines and placed on the binary memory device data lines;

wherein said first binary-to-multilevel data signal converters transform data signals from the binary memory device data lines to the multilevel memory system data lines;

wherein said first multilevel-to-binary data signal converters transform data signals from the multilevel memory system data lines to the binary memory system data lines.

2. The memory access control system of claim 1, wherein the memory system controller is a processing unit such as a microprocessor chip, a processor module, or a processor block on a system board.

3. The memory access control system of claim 1, wherein the memory system controller is a memory bus controller such as a core logic chipset.

4. The memory access control system of claim 1, wherein the binary-to-multilevel data signal converter is a digital-to-analog converter and the multilevel-to-binary data signal converter is an analog-to-digital converter.

5. The memory access control system of claim 1, wherein a memory device is a semiconductor memory chip such as a read-only memory, a random access memory, or a non-volatile memory.

6. The memory access control system of claim 1, wherein one or more of said first multilevel-to-binary data signal converters or said first binary-to-multilevel data signal converters supports conversion for signals with variable number of levels.

7. The memory access control system of claim 1 further comprises a plurality of second binary-to-multilevel data signal converters to transform data signals from the binary memory system data lines to the multilevel memory system data lines and a plurality of second multilevel-to-binary data signal converters to transform data signals from the multilevel memory system data lines to the binary memory device data lines.

8. The memory access control system of claim 1 further comprises a plurality of multilevel memory subsystem address-control lines, a plurality of binary-to-multilevel address signal converters to transform address-control signals from the memory system address-control lines to the multilevel memory sub-system address-control lines, and a plurality of multilevel-to-binary address signal converters to transform address-control signals from the multilevel memory sub-system address-control lines to the memory device address-control lines.

9. A memory chip or module unit comprising:

(a) a plurality of memory unit address-control lines;

(b) a plurality of binary memory unit data lines;

(c) a plurality of multilevel memory unit data lines;

(d) a plurality of first multilevel-to-binary data signal converters;

(e) a plurality of memory sub-units each having a plurality of memory sub-unit address-control lines, a plurality of binary memory sub-unit data lines, a plurality of binary memory cells, and a plurality of first binary-to-multilevel data signal converters;

wherein memory address-control signals on the memory sub-unit address-control lines are derived, at least in part, from the memory unit address-control lines;

wherein memory data from memory cells are selected by the memory sub-unit address-control lines and placed on the binary memory sub-unit data lines;

wherein said first binary-to-multilevel data signal converters transform data signals from the binary memory sub-unit data lines to the multilevel memory unit data lines;

wherein said first multilevel-to-binary data signal converters transform data signals from the multilevel memory unit data lines to the binary memory unit data lines.

10. The memory unit of claim 9, wherein the unit is a semiconductor memory chip and the sub-unit is a semiconductor memory device die.

11. The memory unit of claim 9, wherein the unit is a memory module and the sub-unit is a memory chip.

12. The memory unit of claim 9 further comprises a plurality of second binary-to-multilevel data signal converters to transform data signals from the binary memory unit data lines to the multilevel memory unit data lines and a plurality of second multilevel-to-binary data signal converters to transform data signals from the multilevel memory unit data lines to the binary memory sub-unit data lines.

13. The memory unit of claim 9 further comprises a multilevel memory system address-control lines, a plurality of binary-to-multilevel address signal converters to transform address-control signals from the memory unit address-control lines to the multilevel memory unit address-control lines, and a plurality of multilevel-to-binary address signal converters to transform address-control signals from the multilevel memory unit address-control lines to the memory sub-unit address-control lines.

14. In combination with a memory control system having a memory system address-control bus, a binary memory system data bus, a multilevel memory system data bus, a signal converter that transforms data signals from the multilevel memory system data bus to the binary memory system data bus, and a memory access controller which generates memory system address-control signals to access memory data through the multilevel memory system data bus, a semiconductor memory device, chip, or module unit comprising:

(a) a plurality of memory unit address-control lines;

(b) a plurality of multilevel memory unit data lines;

(c) a plurality of binary-to-multilevel data signal converters;

(d) a plurality of memory sub-units each having a plurality of memory sub-unit address-control lines, a plurality of binary memory sub-unit data lines, and a plurality of binary memory cells;

wherein memory address-control signals on the memory sub-unit address-control lines are derived, at least in part, from the memory unit address-control lines;

wherein memory data from memory cells are selected by the memory sub-unit address-control lines and placed on the binary memory sub-unit data lines;

wherein the binary-to-multilevel data signal converters transform data signals from the binary memory sub-unit data lines to the multilevel memory unit data lines.

15. The memory unit of claim 14, wherein the unit is a semiconductor memory device die and the sub-unit is a semiconductor memory array.

16. The memory unit of claim 14, wherein the unit is a semiconductor memory chip and the sub-unit is a semiconductor memory device die.

17. The memory unit of claim 14, wherein the unit is a memory module and the sub-unit is a memory chip.

18. The memory a unit of claim 14 further comprises a plurality of multilevel-to-binary data signal converters to transform data signals from the multilevel memory unit data lines to the binary memory sub-unit data lines.

19. The memory a unit of claim 14 further comprises a plurality of multilevel-to-binary address signal converters to transform address-control signals from the memory unit address-control lines to the memory sub-unit address-control lines.

* * * * *